United States Patent
Granicher et al.

(10) Patent No.: US 7,245,134 B2
(45) Date of Patent: Jul. 17, 2007

(54) PROBE CARD ASSEMBLY INCLUDING A PROGRAMMABLE DEVICE TO SELECTIVELY ROUTE SIGNALS FROM CHANNELS OF A TEST SYSTEM CONTROLLER TO PROBES

(75) Inventors: Dane C. Granicher, Moraga, CA (US);
Roy J. Henson, Pleasanton, CA (US);
Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/048,167

(22) Filed: Jan. 31, 2005

(65) Prior Publication Data

US 2006/0170435 A1    Aug. 3, 2006

(51) Int. Cl.
*G01R 31/02*    (2006.01)

(52) U.S. Cl. .................... 324/754; 324/158.1

(58) Field of Classification Search ........ 324/754–762, 324/765, 158.1, 73.1; 714/724–733; 702/117, 702/119, 122
See application file for complete search history.

(56) References Cited

U.S. PATENT DOCUMENTS

| | | | |
|---|---|---|---|
| 4,746,855 A | * | 5/1988 | Wrinn .......................... 324/763 |
| 5,491,427 A | * | 2/1996 | Ueno et al. .................. 324/754 |
| 5,736,850 A | | 4/1998 | Legal |
| 6,400,173 B1 | * | 6/2002 | Shimizu et al. ............. 324/765 |
| 6,539,531 B2 | | 3/2003 | Miller et al. |
| 6,603,323 B1 | | 8/2003 | Miller et al. |

OTHER PUBLICATIONS

U.S. Appl. No. 10/693,133, filed Apr. 28, 2005, Miller.
U.S. Appl. No. 10/828,755, filed Oct. 27, 2005, Miller et al.

\* cited by examiner

*Primary Examiner*—Vinh P. Nguyen
(74) *Attorney, Agent, or Firm*—N. Kenneth Burraston

(57) ABSTRACT

A probe card of a wafer test system includes one or more programmable ICs, such as FPGAs, to provide routing from individual test signal channels to one of multiple probes. The programmable ICs can be placed on a base PCB of the probe card, or on a daughtercard attached to the probe card. With programmability, the PCB can be used to switch limited test system channels away from unused probes. Programmability further enables a single probe card to more effectively test devices having the same pad array, but having different pin-outs for different device options. Reprogrammability also allows test engineers to re-program as they are debugging a test program. Because the programmable IC typically includes buffers that introduce an unknown delay, in one embodiment measurement of the delay is accomplished by first programming the programmable IC to provide a loop back path to the test system so that buffer delay can be measured, and then reprogramming the programmable IC now with a known delay to connect to a device being tested.

14 Claims, 6 Drawing Sheets

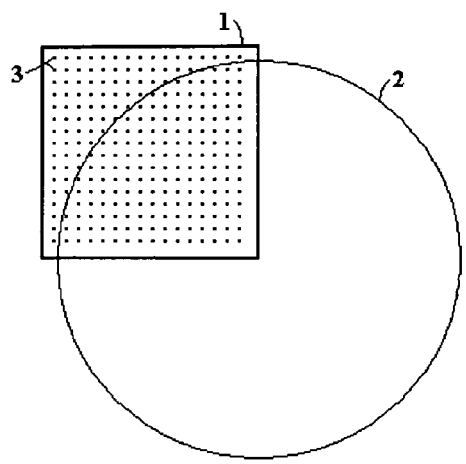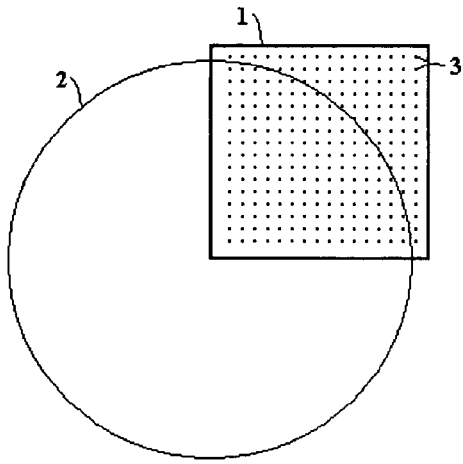
FIG. 1A          FIG. 1B
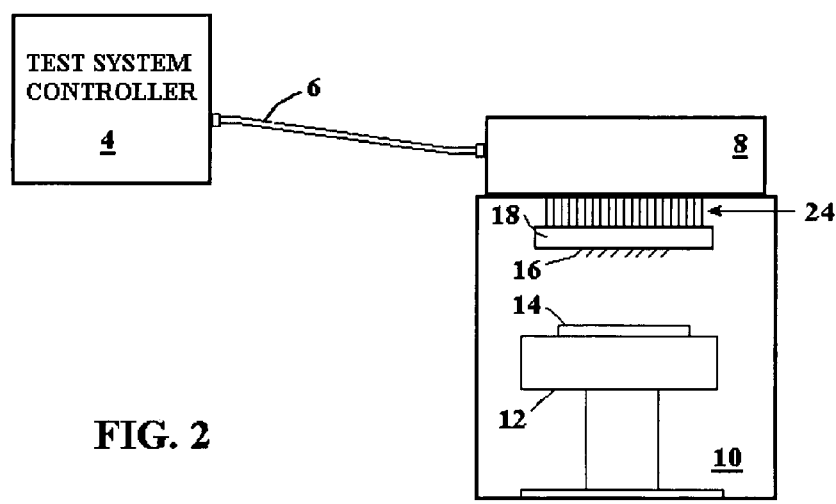
FIG. 2

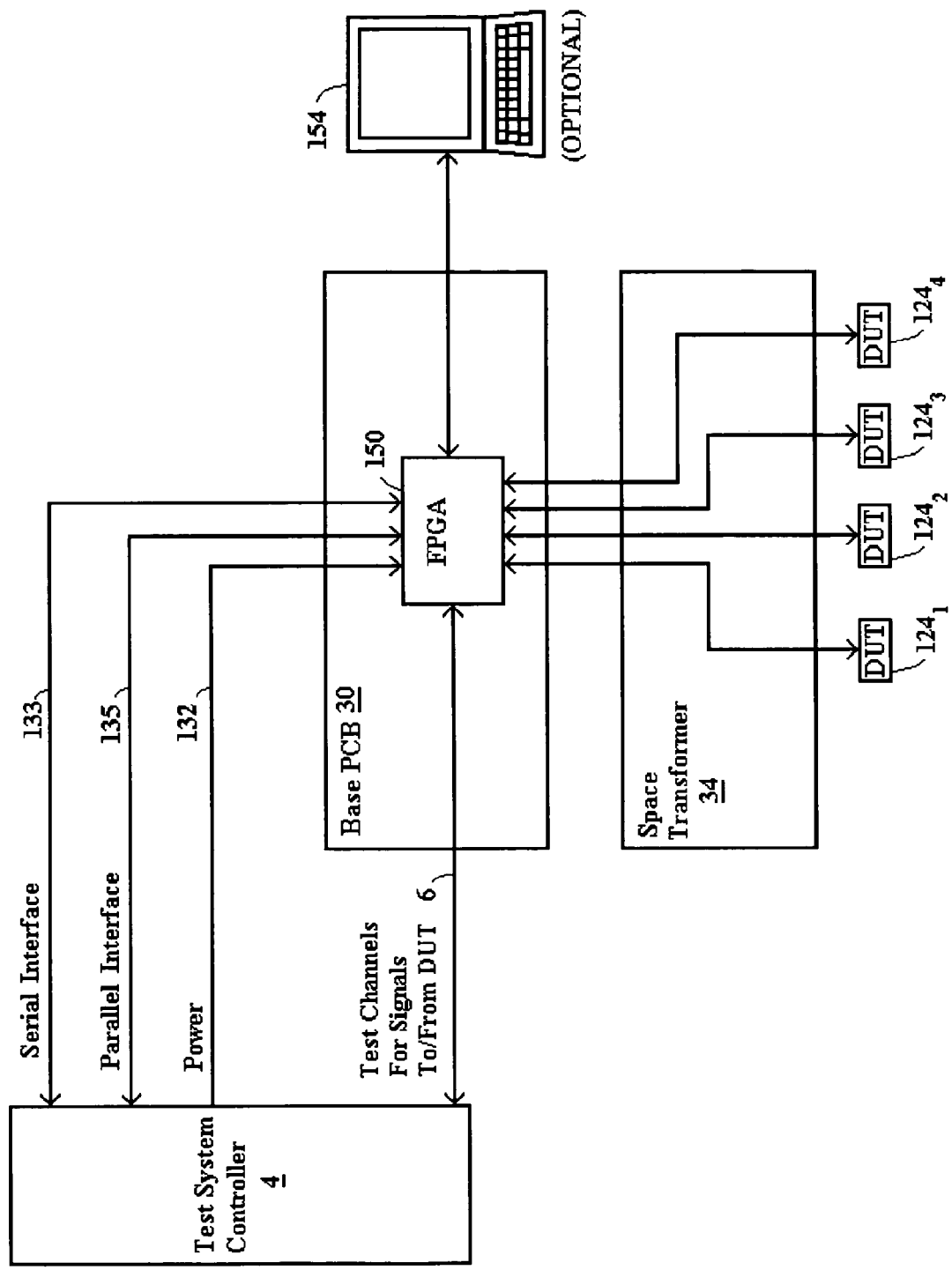

PROBE CARD ASSEMBLY INCLUDING A PROGRAMMABLE DEVICE TO SELECTIVELY ROUTE SIGNALS FROM CHANNELS OF A TEST SYSTEM CONTROLLER TO PROBES

BACKGROUND

1. Technical Field

The present invention relates to routing signals through a probe card of a test system used to test integrated circuits (ICs) on a wafer.

2. Related Art

A test system controller with increased test channels is a significant cost factor for a test system, as is a probe card with components to routing lines to accommodate a limited number of test system channels. Test system controllers have evolved to increase the number of channels and hence the number of devices that can be tested in parallel. Unfortunately, wafer size has typically outpaced the development of test system controllers, so available channels are typically inadequate for testing all Devices Under Test (DUTs) on a wafer at the same time. It is, thus, desirable to provide a probe card that allows increased test flexibility.

One conventional way to accommodate efficient testing of components on a wafer with a limited number of test channels, is to switch the test channels between different probe contacts on the probe card. Schemes used by probe card manufacturers for switching channels on a probe card include relays, analog switches and jumpers. One scheme that includes switches in a test system is described in U.S. Pat. No. 5,736,850 entitled "Configurable Probe Card For Automatic Test Equipment," by Dennis Legal, assigned to Teradyne, Inc. The benefit of switching channel paths is illustrated by FIGS. 1A–1B. In FIGS. 1A–1B, testing of a wafer is performed by moving a probe card 1 over four different quadrants of a wafer 2, two quadrants being shown. As illustrated in FIG. 1A, only a portion of the probe contacts 3 of the probe card 1 are over the wafer enabling testing. Hence, switching is used to reroute channels from the test probes not over the wafer to test probes over the wafer in the probe card 1 to accommodate testing in quadrants as shown. As shown in FIG. 1B, probe contacts that were over the wafer in FIG. 1A are no longer over the wafer, while some contacts not over the wafer in FIG. 1A have now been moved over the wafer in FIG. 1B. Thus, switching again can be performed between the step shown in FIG. 1A and the step of FIG. 1B to connect test system channels to test probes provided over the wafer. Drawbacks to conventional switching schemes on probe cards include: relays being notoriously unreliable, jumpers being usable only a few times before the bond pads will no longer take solder, and analog switches do not provide the signal swapping density often desired for flexibility.

Another conventional way to accommodate efficient testing of components on a wafer with a limited number of test channels, is to fan out a signal from a test system controller in the probe card to multiple transmission lines. In other words, test signals normally provided to a single DUT are fanned out to multiple DUTs in the probe card. This method can enable testing of all DUTs during a single touchdown with a limited number of test system channels, a condition suitable for burn in testing where during heating of the wafer multiple touch downs of the probe card to the wafer is sometimes impractical.

To better assure test integrity with fan out, increased circuitry is provided on the probe card to minimize the effect of a fault on one of the fan out lines. A fault (short circuit) in a component connected on a fanned out line will severely attenuate the test signal for all devices on the fanned out test system channel. U.S. Pat. No. 6,603,323 entitled "Closed-Grid Bus Architecture For Wafer Interconnect Structure," incorporated herein by reference, describes a solution by providing isolation resistors between the channel line branch points and probes to reduce attenuation caused by the faulty component. A further solution is provided in U.S. patent application Ser. No. 10/693,133, incorporated herein by reference, entitled "Isolation Buffers With Controlled Equal Time Delays" describing a system where isolation buffers are used between channel line branch points and probes, with circuitry included to assure the isolation buffers each provide a uniform delay.

FIG. 2 shows, for reference, a conventional test system block diagram. The test system includes a test system controller 4, or general purpose computer, connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact DUTs formed on the wafer 14.

In the test system, test data is generated by the test system controller 4 and transmitted through the communication cable 6, test head 8, probe card 18, probes 16 and ultimately to DUTs on the wafer 14. Test results are then provided from DUTs on the wafer back through the probe card 18 to the test head 8 for transmission back to the test system controller 4. Once testing is complete, the wafer is diced up to separate the DUTs.

Test data provided from the test system controller 4 is divided into the individual test channels, provided through the cable 6 and separated in the test head 8 so that each channel is carried to a separate one of the probes 16. The channels from the test head 8 are linked by connectors 24, such as flexible cable connectors, pogo pins or ZIF connectors to the probe card 18. The probe card 18 then links each channel to a separate one of the probes 16.

FIG. 3 shows a cross sectional view of components of a typical probe card 18. The probe card 18 is configured to provide both electrical pathways and mechanical support for the spring probes 16 that will directly contact the wafer. The probe card electrical pathways are provided through a printed circuit board (PCB) 30, an interposer 32, and a space transformer 34. Test data from the test head 8 is provided through flexible cable connectors 24 typically connected around the periphery of the PCB 30. Channel transmission lines 40 distribute signals from the connectors 24 horizontally in the PCB 30 to contact pads on the PCB 30 to match the routing pitch of pads on the space transformer 34. Switching elements 25 (including relays, analog switches, or jumpers) are provided on the PCB 30 in the path of at least some channel transmission lines 40 to enable for selectively routing the channel to a number of different paths on the PCB 30. The interposer 32 includes a substrate 42 with spring probe electrical contacts 44 disposed on both sides. The interposer 32 electrically connects individual pads 31 on the PCB 30 to pads forming a land grid array (LGA) on the space transformer 34. Traces 46 in a substrate 45 of the space transformer 34 distribute or "space transform" connections from the LGA to spring probes 16 configured in an array. The space transformer substrate 45 is typically constructed from either multi-layered ceramic or organic based laminates. The space transformer substrate 45 with embedded circuitry, probes and LGA is referred to as a probe head.

Mechanical support for the electrical components is provided by a back plate 50, bracket (Probe Head Bracket) 52, frame (Probe Head Stiffener Frame) 54, leaf springs 56, and leveling pins 62. The back plate 50 is provided on one side of the PCB 30, while the bracket 52 is provided on the other side and attached by screws 59. The leaf springs 56 are attached by screws 58 to the bracket 52. The leaf springs 56 extend to movably hold the frame 54 within the interior walls of the bracket 52. The frame 54 then includes horizontal extensions 60 for supporting the space transformer 34 within its interior walls. The frame 54 surrounds the probe head and maintains a close tolerance to the bracket 52 such that lateral motion is limited.

Leveling pins 62 complete the mechanical support for the electrical elements and provide for leveling of the space transformer 34. The leveling pins 62 are adjusted so that brass spheres 66 provide a point contact with the space transformer 34. The spheres 66 contact outside the periphery of the LGA of the space transformer 34 to maintain isolation from electrical components. Leveling of the substrate is accomplished by precise adjustment of these spheres through the use of advancing screws, or leveling pins 62. The leveling pins 62 are screwed through supports 65 in the back plate 50 and PCB 30. Motion of the leveling pin screws 62 is opposed by leaf springs 56 so that spheres 66 are kept in contact with the space transformer 34.

FIG. 4 shows an exploded assembly view of components of the probe card of FIG. 3. FIG. 4 shows attachment of the back plate 50, PCB 30, and bracket 52 using two screws 59. Four leveling screws 62, are provided through the back plate 50 and PCB 30 to contact four spheres 66 near the corners of the space transformer substrate 34. The frame 54 is provided directly over the space transformer substrate 34, the frame 54 fitting inside the bracket 52. The leaf springs 56 are attached by screws 58 to the bracket 52. Two screws 58 are shown for reference, although additional screws 58 (not shown) are provided around the entire periphery to attach the leaf springs.

FIG. 5 shows a perspective view of the opposing side of PCB 30 illustrating the arrangement of connectors 24 and switches 25 formed around the periphery of PCB 30. In FIG. 5, the connectors 24 and switches 25 of the PCB 30 are facing down and not shown. In typical probe cards, the connectors 24 are located around the periphery of the probe card, and are configured to mate with connectors that are typically arranged in a similar fashion on the test head. The switches 25 are typically large components with a limited number of switching elements that occupy a considerable amount of space. The switches 25 are provided between the connectors 24 and pads on the opposing side of PCB 30. The switches 25 are provided in spacing available if such spacing exists between the probe card and test head.

SUMMARY

In accordance with the present invention, a probe card is provided with a programmable IC, such as a Field Programmable Gate Array (FPGA), Programmable Logic Device (PLD), Application Specific Integrated Circuit (ASIC) or other IC providing programmable routing from individual test signal channels to a number of different probes. Such programmable ICs provide a greater switching density and longer lifecycle than other conventional switches. The programmable IC would be more reliable than relays, would not be permanent like soldered jumper wires, and would provide much greater flexibility with less PCB real estate used than analog switches.

With programmability, the same PCB can be used for partial wafer testing to switch limited test system channels away from unused probes, as illustrated in a test environment with respect to FIGS. 1A–1B. Further with programmability, the same PCB can be used for many DUT designs by simply reprogramming the IC to route signals, power and ground to appropriate locations on the DUT as those locations vary. Programmable ICs further enable a single probe card to more effectively test devices with the same pad array, but having different pin-outs for different device options.

The programmable switching IC, as typical of FPGAs, would be electrically erasable and field re-programmable. Programming can be performed using the automatic test system controller attached to the probe card. Programming can also be performed by attaching a separate programming device connected by a cable to the probe card. Reprogrammability also allows test engineers to re-program as they are debugging a test program configured to send signals, power and ground to appropriate DUT contacts for testing.

A programmable switching IC, such as an FPGA, can replicate the current and voltage on a channel path between a DUT and a tester, but with buffering typically included in the programmable IC, delay will be introduced in measurements on the test channels. Accordingly, in one embodiment compensation is provided in the test measurements to eliminate the delay introduced. To characterize the delays, the programmable IC is first programmed so that a channel path is provided through the programmable IC that loops back to the test system controller. Measurements are then made by the test system controller to determine the delay introduced in the channel path by the programmable IC. With the delay introduced by the programmable IC now known, the programmable IC is reprogrammed to connect the channels directly to DUTs, and the known delay introduced is subtracted from the total measured delay to enable an accurate determination of overall delay introduced by the test system.

The programmable ICs can be provided on the PCB 30, similar to the switches 25 shown in FIG. 5. With a limited size, the programmable ICs can also be provided on the surface of the interposer or space transformer. Further, in accordance with the present invention, the programmable ICs can be provided on daughter cards attached by connectors to the PCB 30 depending on space limitations.

In combination with using programmable switching ICs, in accordance with the present invention, further on board features can be provided to enabling fan out of a test channel signal to multiple DUTs while limiting undesirable effects of fan out on test results. Details of on board features to enable fan out are described in U.S. patent application Ser. No. 10/828,755, entitled "Intelligent Probe Card Architecture," filed Apr. 21, 2004 by Miller, et al., which is incorporated herein by reference.

BRIEF DESCRIPTION OF THE DRAWINGS

Further details of the present invention are explained with the help of the attached drawings in which:

FIGS. 1A–1B illustrate a probe card provided in two different positions of a wafer for testing the wafer in quadrants to illustrate use of the switches on the probe card;

FIG. 2 shows a block diagram of components of a conventional wafer test system;

FIG. 8 shows an alternative circuit diagram for components of the probe card of FIG. 6.

DETAILED DESCRIPTION

Figure 3:
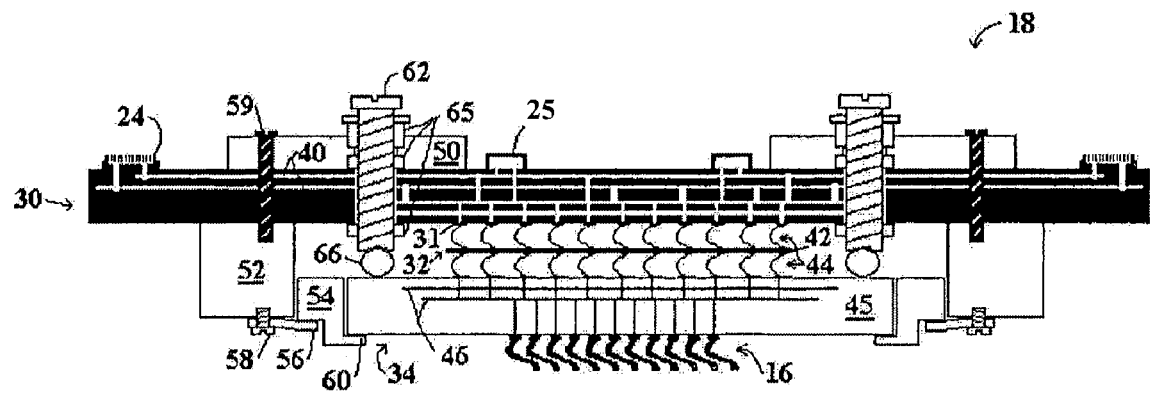
FIG. 3 is a cross sectional view of a conventional probe card for the wafer test system of FIG. 1.
Figure 4:
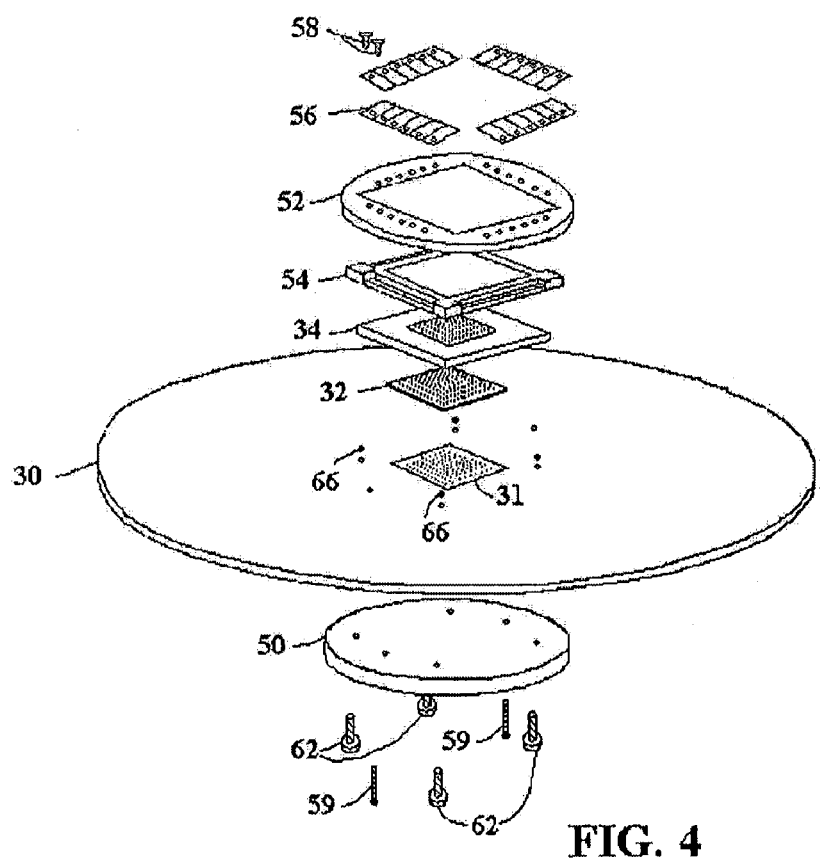
FIG. 4 is an exploded assembly view of components of the probe card of FIG. 3.
Figure 5:
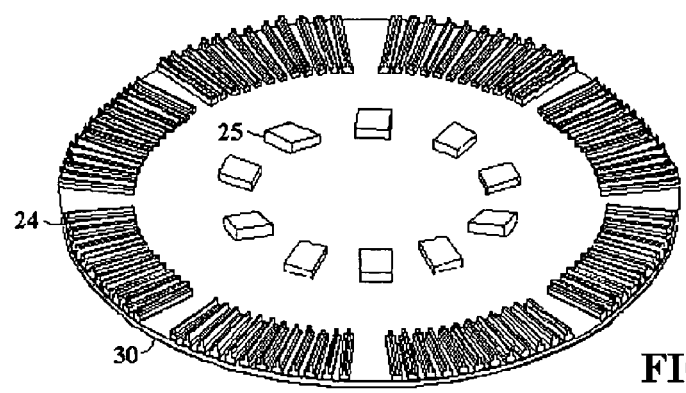
FIG. 5 is a perspective view of the PCB of FIG. 3 showing connectors for connecting to a test head, and switches.
Figure 6:
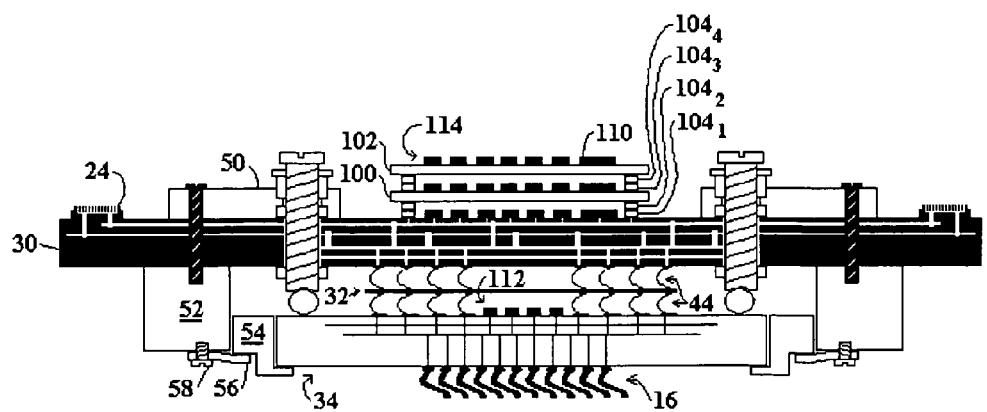
FIG. 6 shows a cross sectional view of a probe card with on board components in accordance with the present invention.

FIG. 6 shows a cross sectional view of a probe card, modified from the probe card configuration shown in FIG. 3 to include on board components, in accordance with the present invention, including daughter cards 100 and 102. For convenience, components carried over from FIG. 3 to FIG. 6 are similarly labeled. The daughter cards are shown in FIG. 6 as connected by stacked connectors $104_{1-4}$. The stacked connectors are attached to opposing card surfaces, and include male and female mating connectors. For example connector $104_1$ is connected to the base PCB 30, while connector $104_2$ is connected to daughter card 100. The stacked connectors can be ZIF, pogo pin, or other type connectors suitable for interconnecting printed circuit boards. The connectors make the daughter cards removable so that different daughter cards can be easily installed, depending on the test environment. Although shown with removable connectors, in one embodiment, the daughter cards can be rigidly connected, such as by soldering. Further, although two daughter cards are shown, a single card or more than two cards can be used, depending on design requirements.

As illustrated, the daughter cards 100 and 102 are provided in available spacing between test system controller interface connectors 24. The test system controller could be a conventional Automatic Test Equipment (ATE) tester or a computer system used to control and configure the probe card, which can limit the height above the connectors 24 which the daughter cards can be stacked. In the configuration shown, an opening is provided in the back plate 50, forming an outline area where the daughter cards 100 and 102 are connected to the base PCB 30. The area of the probe card available for daughter cards is generally dictated by the test system controller connection and prober constraints. With limited horizontal spacing between test system controller interface connectors 24, board area to accommodate additional circuitry for the architecture in accordance with the present invention is obtained by stacking additional daughter cards within the outline area of the probe card.

The stacked connectors $104_{1-4}$ provide spacing for discrete components 114 provided on the surface of each of the base PCB 30 and daughter cards 100 and 102. The discrete components 114 can include bypass capacitors for power supply lines. In one embodiment, similar discrete components 112 are also provided on a surface of the space transformer 34. To accommodate the discrete components 112, a number of spring contacts 44 are removed from the interposer 32, and rerouting of lines is provided in the space transformer 34.

The daughter cards, such as 100 and 102 shown, may be redundant with the base PCB 30, in that they carry the same discrete components on their surface. More redundant daughter cards can be simply added if more fan out of test channels is desired. Alternatively, the daughter cards can include differing components depending on test requirements and available space.

The daughter card 102 is shown to include a micro-controller 110 as a discrete component 114. Although shown on daughter card 102, similar micro-controllers can be provided on one or more of the daughter card 102, daughter card 100, base PCB 30, and space transformer 34. The micro-controller IC 110 may be any of a variety of programmable controllers including a microprocessor, digital signal processor, FPGA, PLD, ASIC or other controller that can be programmed/configured to provide test or control signals to electrical circuits.

The discrete components 114 on a daughter card or base PCB 30, or components 112 on the space transformer can include a memory for use by the micro-controller 110, or by another processor either on the probe card, or external to the probe card. The memory can be a random access memory (RAM) providing temporary storage, or a device providing more permanent storage such as a flash memory. To enable the micro-controller 110, or other programmable IC to perform testing, the memory can be programmed to include test vectors or a test program. Similarly, the memory can include system configuration data.

Discrete components 114 in addition to the micro-controller 110 and memory can further include voltage regulators, relays, multiplexers, switches, D/A converters, A/D converters, shift registers, etc. Examples for the configuration of the discrete components are shown in the circuit diagrams of FIG. 7 and FIG. 8. Further details of these components, as well as other features included on the probe card in accordance with the present invention are described below.

A. DUT Signal Isolation

Figure 7:
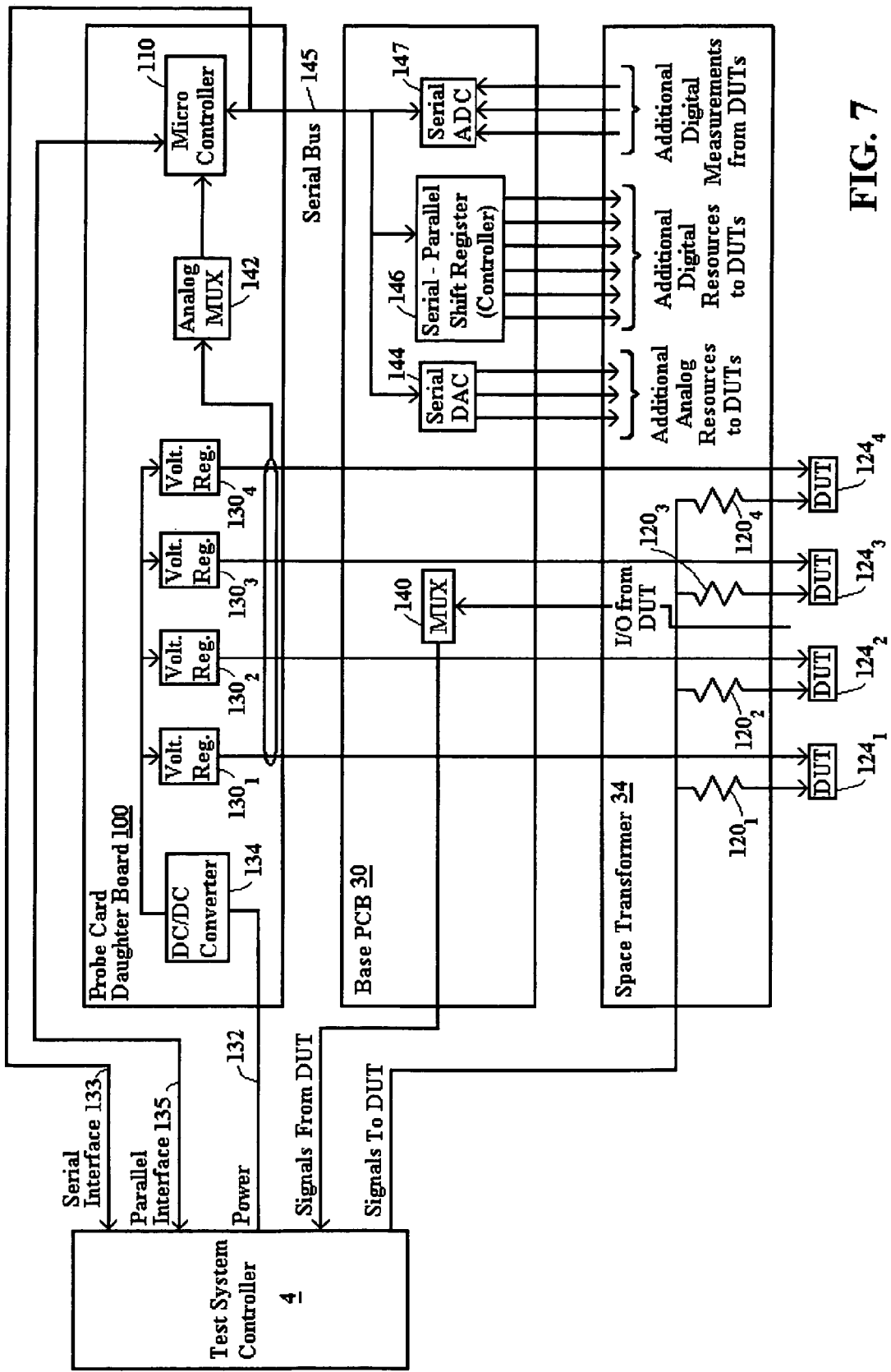
FIG. 7 shows a circuit diagram for components of the probe card of FIG. 6.

In one embodiment the space transformer 34 includes thin film resistors placed in series with each probe that provides a DUT input. Such thin film resistors $120_{1-4}$, providing signals from a single channel of test system controller 4 to inputs of DUTs $124_{1-4}$ are illustrated in FIG. 7. As described previously, the architecture in accordance with the present invention uses embedded resistors, such as resistors $120_{1-4}$, in the space transformer 34 placed in series with each DUT input to isolate failed or shorted DUTs from good DUT inputs. The space transformer 34, illustrated in FIG. 6, is typically a multi-layer ceramic substrate, or may be made up of a multi-layer organic substrate, with the thin film resistors $120_{1-4}$ provided on one or more layers in the path of routing lines to the probes. Use of such DUT isolation resistors is described in U.S. Pat. No. 6,603,323, reference previously. Discrete or surface mounted resistors can also be used for this DUT isolation application.

In a further embodiment, as an alternative to series resistors, buffers are placed in series with each DUT input to isolate failed DUTs, as described in U.S. patent application Ser. No. 10/693,133. Circuitry is then included on a the base PCB or daughter card to assure the delay provided in each line having a buffer is uniform, as described in the application Ser. No. 10/693,133.

B. DUT Power Isolation and Power Control

The system might be limited in the number of DUT power supplies it has available. When using a single power supply to drive multiple DUTs, it is desirable to isolate failed or shorted DUTs from affecting the other good devices connected to the same test system controller power supply. It is further desirable to control the power provided since a reduction of power can occur with each channel branch added.

The present architecture uses voltage regulators, current limiters or switches in series with each DUT power pin to isolate failed DUTs. Use of voltage regulators $130_{1-4}$ from a power supply channel 132 of the test system controller 4 is illustrated in FIG. 7. Although shown provided from the test system controller 4, power can likewise be provided from separate power supplies. The voltage regulators $130_{1-4}$ have power supplied from the test system controller power supply line 132, and distribute the signal power line to power multiple DUTs $124_{1-4}$. The voltage regulators $130_{1-4}$ function to isolate failed DUTs from the good DUTs operating from the same voltage source by detecting current surges caused by a DUT with a short, or similar fault, and then cutting off or minimizing current to the DUT. Although shown as a voltage regulator in FIG. 7, the voltage regulators $130_{1-4}$ can be replaced by switches or current limiters with similar feedback enabling isolation of a failed DUT.

In addition to power supply isolation, the present architecture provides for increasing power from a DUT power supply channel to enable a single power supply to drive more DUTs. To increase power, a DC/DC converter 134 is provided on daughter card 100 between the test system controller 4 and the DUT voltage regulators $130_{1-4}$ to provide additional DUT power. The test system controller power supplies generally have a programmable voltage output with a fixed maximum current. Many new silicon devices operate at lower voltages. Hence, the test system controller can be programmed to a higher voltage and the DC/DC converter 134 can regulate down to a lower voltage and higher current enabling the test system controller power supply to drive more DUTs.

To assure a precise voltage is provided to the test system, an embodiment of the present invention provides for calibration and monitoring of the voltage regulators $130_{1-4}$, as well as other probe card components. The micro-controller 110 is shown connected to monitor the output of voltage regulators voltage regulators $130_{1-4}$ to determine when current is cut off due to a DUT failure. In addition to receiving a current signal, the micro-controller 110 of the probe card can be configured to calibrate the voltage regulators $130_{1-4}$ to enable accurate control of the voltage provided from the regulators.

C. Probe Card Self Test

As parallelism for testing is provided by fan out in the probe card and test functionality is moved onto the probe card, it becomes desirable to include features on the probe card to insure probe card test function integrity without requiring additional test system controller functionality. In a conventional probe card, the test system controller can generally monitor each channel for integrity. When test system controller resources are distributed among several DUTs and components are added to isolate DUTs, probe card integrity checks made by the test system controller may no longer be valid checks of the test system.

Accordingly, in one embodiment shown in FIG. 7 the present architecture performs self testing of a combination of the micro-controller 110, serial-parallel register (controller) 146, multiplexers 140 and 142, D/A converter 144, A/D converter 147 and other circuit components used to assure integrity of the test functions added to the probe card. The modes of operation performed with the micro-controller 110, or processing units on other daughter cards or the base PCB 30 provide for self test allowing the individual daughter card PCB assemblies and base PCB assembly to be tested.

The probe card can be configured, or include software in memory to provide for self-testing. Test results are reported from the probe card to the test system controller 4, or other user interface. The micro-controller 110 can also include a programmable mode allowing the probe card to be reconfigured to allow probe card testing using standard probe card test metrology tools. One example of a standard metrology tool that may be used is the probeWoRx system manufactured by Applied Precision Inc. Use of a probe card with such programmable modes allows self test to be performed in the wafer production test environment.

D. Serial Bus Interface

To minimize the amount of routing lines and connector resources needed with use of the daughter cards, a serial bus 145 is provided with the present architecture. The micro-controller 110 in FIG. 7 provides a serial bus interface in one embodiment to control the serial bus 145 without additional area overhead. The serial bus 145 of the probe card allows for distribution of the probe card built in self test (BIST) features with a minimum number of interface wires. The serial bus is a key enabler of the probe card BIST functionality.

The serial interface bus 145 is provided between the daughter card 100 (and other daughter cards if used) and base PCB 30. The serial bus enables communication between the base PCB 30 and daughter cards with a minimum number of connector and wiring resources. The serial to parallel converter, such as serial-parallel shift register 146 is provided on the base PCB 30 for distributing the serial bus signals to individual DUTs internal to the PCB 30 with a minimum amount of routing lines and connector resources.

Although shown as a simple serial-parallel shift register, the serial-parallel shifting device 146 may be a programmable controller such as a processor, DSP, FPGA, PLD, or micro-controller providing similar functionality to the micro-controller 110 on daughter card 100, with a basic function of providing parallel to serial conversion. As a processor, the unit 146 can also be configured to perform self test functions, serve to provide programming or data to other processors on the daughter cards, and serve to provide a daisy chained connection of processors through the serial bus 145.

As a processor, the serial/parallel controller unit 146 can further utilize compressed data formats, and can function to compress and decompress data and test vectors. For example, the serial/parallel controller unit 146 can be configured to receive BCD data from components not attached to the serial bus and convert the BCD data to serial data for subsequent distribution. Similar data compression and decompression can be provided by other programmable controllers or processors included on one of the daughter cards 100 and 102 or base PCB 30 of the probe card.

Similarly, the serial/parallel controller unit 146 configured as a processor can enable the probe card to support scan test features of the DUT. Programmable logic and memory chips can have a serial scan port to provide for scan testing. The scan port is typically used in manufacturing to provide for a built in self test (BIST) of the chip, with the scan port not later being connected to a package lead after manufacture. With a connection of a DUT scan port to the serial/parallel controller unit, or other scan test circuitry attached to the serial bus, scan test features of the DUT can be enabled by the daughter card either in conjunction with or separate from the test system controller 4.

The serial bus interface 133 to the test system controller 4 is further shown in FIG. 7, providing for serial communication from the test system controller 4 with a minimal number of wiring and connector resources. With the serial interface 133, the test system controller 4 can route control signals to the serial to parallel converter 146, or to the micro-controller 110. The serial interface 133 can be provided from the JTAG serial port of the test system controller 4 in one embodiment, with a scan register of the test system controller 4 used to provided serial control signals from the test system controller 4.

Although the test system controller 4 is shown to have a serial interface 133 connection with the micro-controller 110, other type communication interfaces can be provided, such as the parallel interface 135 shown. The additional interfaces can be used either in combination with the serial interface, or alone. Other types of interfaces can include RF, wireless, network, IR, or various connections as the test system controller 4 may have available. Although shown connected only to the micro-controller 110, interface 135 can be connected to other devices on the probe card either directly or over a bus.

The serial bus 145 can also be used to distribute analog signals to and from the DUTs. The present architecture includes a serial digital to analog converter 144 to convert serial signals to analog form and distribute the signals to multiple DUTs. The D/A converter 144 receives a test signal input through the serial bus 145 from the serial-parallel shift register 146, although the signal could be provided from other components connected to the serial bus 145. The D/A converter 144 can contain multiple D/A converters per package (typically 8, 16 or 32 per package) that are connected to the serial interface bus 145 for delivering analog voltages to the DUTs with a minimum wiring and PCB area. An A/D converter 147 is further included to receive analog signals from the DUTs and convert to a digital form to provide signals over the serial bus, preferably to the serial-parallel shift register. An analog multiplexer 142 is further provided to provide feedback from the outputs of the voltage regulators $130_{1-4}$ to the micro-controller 110 to enable the micro-controller to assure the voltage regulators $130_{1-4}$ are functioning properly for both self test, and test integrity assurance.

E. Programmable IC Routing

FIG. 8 shows an alternative circuit diagram to FIG. 7 for components that may be used on the probe card of FIG. 6. The circuit of FIG. 8 modifies FIG. 7 by using an FPGA 150 to replace the serial-parallel shift register 146, as well as other discrete components shown on the base PCB 30 and daughtercard 100 of FIG. 7. Additionally, or alternatively, the FPGA 150, or other programmable IC, can provide programmable routing to selectively direct individual test channels 6 to one of multiple probe contacts.

As described previously with FIG. 2–6, connectors 24 distribute signals from the test system controller 4 to connectors 24 of the base PCB 30. Channel transmission lines 40 then distribute signals from the connectors 24 horizontally in the PCB 30 for connection to DUTs. In FIG. 8, the test channels 6 are routed through the FPGA 150 on the base PCB 30 to enable routing resources of the test system controller 4 to be programmably connectable to different DUTs. Similarly, power lines 132 are connected through the FPGA 150 for programmable connection to different DUTs.

The FPGA 150 simply serves as a programmable switch matrix. Control signals from interface lines 133 and 135 are further provided either serially or directly from the test system controller 4 to provide control signals to the FPGA 150 and to program the FPGA 150. Connection to the FPGA 150 for programming can further be made through a separate connection from a user interface (not shown) to the FPGA 150 allowing the FPGA 150 to be reprogrammed to reconfigure trace routing as desired. Although not shown, trace routing from the FPGA 150 can be branched as described with respect to FIG. 7 using components such as isolation resistors $120_1–120_4$, shown previously.

Conventionally, routing was only provided with some type of space transformation, either using the space transformer 34 or base PCB 30. Once traces were manufactured, there was little flexibility in making changes. Some flexibility was built into probe cards using conventional components such as relays, analog switches, or jumpers to provide rerouting of the traces. Relays are unreliable and jumpers are labor intensive and can only be reconnected a limited amount of times, as indicated previously. Like relays, analog switches are still large, and are limited to low frequency testing.

Using a programmable IC with internal switching, such as FPGA 150, provides a greater degree of flexibility, allowing the same probe card to be used for many designs by simply reprogramming the IC. The FPGA 150 provides significantly more switching capability than a relay or analog switch and is reliable. The FPGA 150 will operate at a higher frequency than the analog switch. Programming of the FPGA allows selective routing of the test channels 6 through switches to different DUTs. Programming of the FPGA further allows for rerouting of channels to different contacts within a DUT to accommodate DUTs having different pinnouts.

The FPGA 150 can be programmed or configured by a program such as Verilog. Programming or configuration of the FPGA 150 can be provided prior to installation of the FPGA 150 on the probe card. Programming or configuration of the FPGA 150 can further be performed after installation using the test system controller 4, or alternatively by using a user interface 154 connected directly to the probe card. The user interface 154 can be a CPU workstation, or other external control device used to reprogram the FPGA. Since the FPGA 150 can be programmed prior to installation and function without reprogramming, the user interface 154 is shown as optional.

Programming of the FPGA may be based on the design database or test bench of the DUT. A design database can include a listing of pin functions for different DUT designs that are expected to be tested in a given test system. The database can be updated to include additional DUT design descriptions as new DUTs are made available for testing. The FPGA can be reconfigured to facilitate specific tests on pinnouts required for DUTs on a wafer provided from the design database, or based on responses from the DUT changing pin functions real-time during testing. In one embodiment, the output of a Computer Aided Design (CAD) design system used to develop the DUT may be used to synthesize the test program loaded into the FPGA. The CAD design database can be used directly or post-processed by design or CAD tools used to design the probe card. A tool used to design the probe card is described in U.S. Pat. No. 6,539,531 entitled, "Method Of Designing, Fabricating, Testing And Interconnecting An IC To External Circuit Nodes," by Miller, et al., incorporated herein by reference. Thus, by using an FPGA in a probe card, a standard or semi-standard probe card may be used and customized by software prior to testing of a specific DUT design. The probe card FPGA may further be reprogrammed or reconfigured in real time for testing of specific DUT designs as described in more to follow.

Reprogrammability or reconfiguration of an FPGA allows test engineers to re-program as they are debugging a test program configured to send signals and power to appropriate DUT contacts for testing. Reprogramming of the FPGA during standard or production testing as part of the test cycle, further provides a way of adding flexibility to the test process. For example, the first set of tests might be done with configuration A, and then the FPGA could be reconfigured to a new arrangement B that is designed to perform a second set of tests. This may coincide with changes to the DUT pin functions during test operations controlled either by on chip circuitry of the DUT or the test system control signals sent to the DUT. The FPGA can reassign test system pin connections from inactive DUT pins to newly active DUT pins, or simply reassign test system pin connections dedicated to a particular pin function to a DUT pin newly assigned to provide that function. Reconfiguration of the FPGA and DUT pin functions can occur real-time during testing without shutting down the test process to reprogram either the FPGA or the DUT pin functions.

The FPGA 150 is preferably located on the base PCB 150 to minimize the number of routing lines and connectors between a daughter card 132 and the base PCB 30, although it is conceivable the FPGA 150 could be included on daughter card 100. The FPGA or other similar programmable IC can likewise be provided on the interposer 32 or space transformer 34.

The FPGA is typically a digital device with integrated I/O buffers that adjust input and output voltages to prescribed limits. Depending on the quality of the buffers, buffering can prevent some parametric tests, including measurement of a small amount of leakage current, or measurement of specific voltages when a short circuit or open circuit is applied. Accordingly, in one embodiment of the present invention the programmable IC, such as an FPGA, is provided without I/O buffering, the programmable IC using transmission gates to provide programmable routing so that parametric tests can be performed.

Although the buffers of a programmable IC or FPGA can replicate the current and voltage received, they will introduce a delay in a test channel path. Accordingly, in one embodiment compensation is provided in the test measurements to eliminate the delay introduced. To characterize the delay, the programmable IC is first programmed so that a channel path is provided through the programmable IC that loops back to the test system controller. Measurements are then made by the test system to determine the delay introduced in the channel path by the programmable IC. With the delay introduced by the programmable IC now known, the programmable IC is reprogrammed to connect the channels directly to DUTs, and the known delay introduced is subtracted from the total measured delay to enable an accurate determination of overall delay introduced by the test system.

Figure 9A:
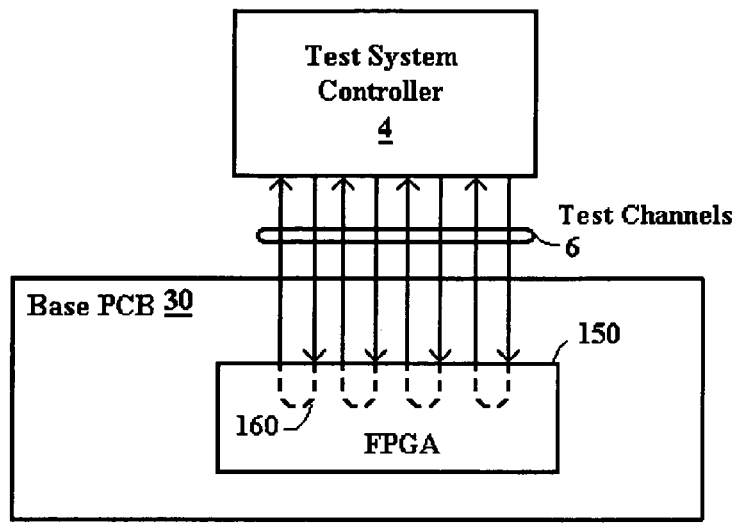
FIGS. 9A–9B show test measurement configurations to enable characterization of delay introduced in a channel by a programmable IC, such as an FPGA.
Figure 9B:
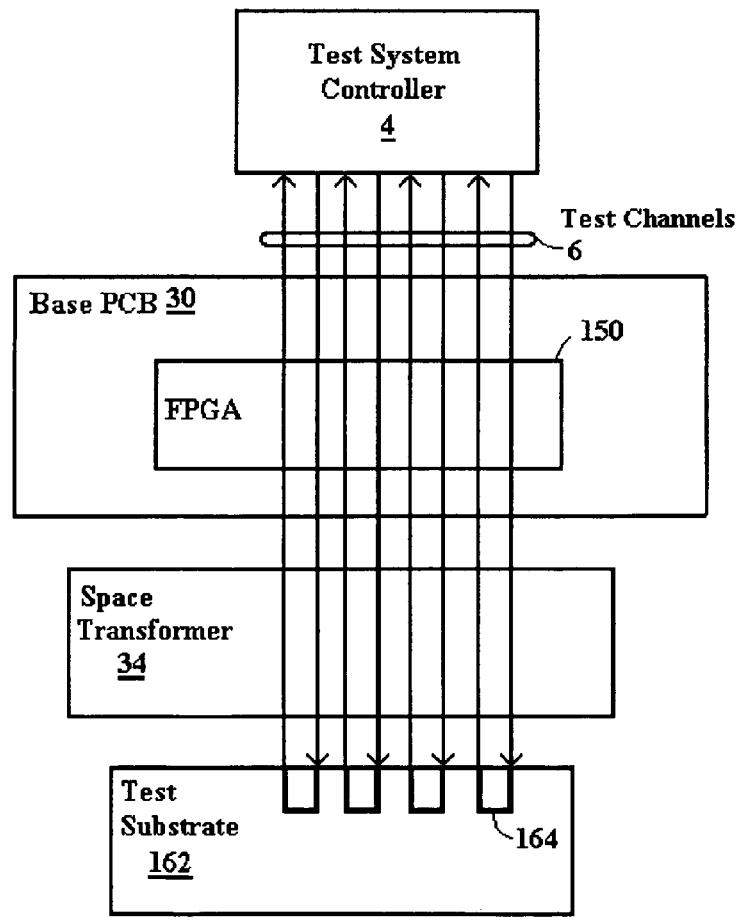

Test configurations used to determine the delay introduced in a channel by the programmable IC (shown as FPGA 150) are illustrated in FIGS. 9A–9B. With either the configuration of FIG. 9A or FIG. 9B, delay can be determined in the actual test environment to eliminate potential delays introduced by variables such as temperature changes. For example, to assure temperature remains the same, the programmable IC is put in the test environment for a time period allowing it to come up to temperature with the remaining test equipment before delay introduced by the programmable IC is measured.

FIG. 9A shows components from FIG. 8 used to determine delay through the FPGA 150 by looping a test signal back to test system 4 within the FPGA 150 as illustrated by dashed lines 160. To determine delay, the FPGA 150 is programmed to provide the loop back paths 160. With the a signal looped back to the test system 4 within the FPGA 150, the delays of both the input buffer and output buffer of the FPGA 150 are encountered. With test system channel delays already known, the delays introduced by the buffers of the FPGA 150 are measured and can be included in the determination of total test system delay. To later measure DUTs, the FPGA 150 is simply reprogrammed to provide signals directly to or from a DUT as illustrated in FIG. 7, while test system delays introduced can be are subtracted out.

FIG. 9B shows an alternative configuration where a test substrate 162 is introduced to determine delay introduced by the test system. The test substrate 162 in the embodiment shown includes traces 164 for looping a test signal back to the test system 4. The system of FIG. 9B allows measurement of the complete delay from the test system 4 through the base PCB 30 and space transformer 34 as well as the delay introduced by the FPGA 150. Total delay is determined by subtracting known delay introduced by a trace 164 in the path and dividing by two to determine delay introduced by only one channel. The traces 164 can be arranged to replicate the channel paths when DUTs are later introduced so that the FPGA will not require reprogramming for DUT measurement after measurements to determine delay. The test substrate 162 is simply removed and replaced with a substrate supporting DUTs.

Although the present invention has been described above with particularity, this was merely to teach one of ordinary skill in the art how to make and use the invention. Many additional modifications will fall within the scope of the invention, as that scope is defined by the following claims.

What is claimed is:

1. A probe card assembly comprising:
   a programmable IC to connect individual test channels to one of a plurality of test probes; and
   a memory storing data for programming the programmable IC, wherein the data enables the programmable IC to be
   first programmed to provide a connection from a test system controller through the programmable IC back to the test system controller to enable measurement of delay through the programmable IC, and
   subsequently reprogrammed to connect to at least one device under test.

2. A probe card assembly comprising:
   a programmable IC to connect individual test channels to one of a plurality of test probes; and
   a daughter card connected to a base PCB, the base PCB including connectors for connecting to a test system controller and routing lines from the connectors to the daughter card, the daughter card supporting the programmable IC.

3. A test assembly including a probe card comprising:
   a space transformer supporting test probes;
   a base PCB comprising:
   test head connectors for connecting to a test system controller;
   a programmable IC;
   channel lines provided from the test head connectors to the programmable IC; and routing lines connecting the programmable IC to the test probes of the space transformer, wherein the programmable IC is programmable to selectively connect individual ones of the channel lines to different ones of the test probes.

4. The test assembly of claim 3 wherein the programmable IC comprises an FPGA.

5. The test assembly of claim 4 further comprising a memory storing data for programming the FPGA, wherein the data enables the FPGA to be first programmed to provide a connection from the test system controller through the FPGA back to the test system controller to enable measurement of delay through the FPGA, and subsequently reprogrammed to connect to the test system controller through the FPGA, the channel lines, the routing lines and the probes to at least one device under test.

6. The test assembly of claim 5 further comprising:

a test substrate having pads interconnected by traces, wherein the pads of the substrate are connectable to the test probes when the FPGA is first programmed to provide a connection from the test system controller through the FPGA back to the test system controller to enable measurement of delay through the FPGA.

7. The test assembly of claim 5 further comprising:

power lines provided from the test head connectors to the programmable IC, wherein the programmable IC is programmable to selectively connect individual ones of the power lines to different ones of the test probes.

8. A method for using a probe card, the method comprising:

programming a programmable IC on the probe card to selectively direct signals from a test system controller through the programmable IC on a test channel back to the test system controller;

measuring delay introduced in the test channel by the programmable IC; and reprogramming the programmable IC to direct signals from the test system controller through the programmable IC on a test channel to connect to a device under test (DUT).

9. The method of claim 8 further comprising:

measuring delay through the channel to the DUT after the step of reprogramming the programmable IC with the delay introduced by the programmable IC cancelled out.

10. The method of claim 9, wherein prior to the steps of programming the programmable IC and reprogramming the programmable IC, the programmable IC is placed in a test environment for the step of measuring delay and allowed to come to substantially the same temperature as other components in the test environment.

11. The method of claim 10, wherein the step of programming is performed by loading a test program from a CAD design system used to develop components on the wafer.

12. The method of claim 10, wherein the step of programming is performed by a user interface connected to the probe card separate from an automatic test system connected to the probe card to provide test signals on the test channel.

13. The method of claim 10, further comprising the step of reconfiguring the IC, the IC comprising an FPGA, to redirect test signals to different ones of the plurality of test probes during testing of the components on the wafer.

14. The method of claim 13, wherein the FPGA is reconfigured in response to a change of pin functions of the components on the wafer.

* * * * *